US008071485B2

(12) United States Patent
Lee et al.

(10) Patent No.: US 8,071,485 B2
(45) Date of Patent: Dec. 6, 2011

(54) METHOD OF SEMICONDUCTOR MANUFACTURING FOR SMALL FEATURES

(75) Inventors: Doug H. Lee, Poughquag, NY (US); Erik P. Geiss, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 205 days.

(21) Appl. No.: 12/494,015

(22) Filed: Jun. 29, 2009

(65) Prior Publication Data

US 2010/0327412 A1    Dec. 30, 2010

(51) Int. Cl.
*H01L 21/461* (2006.01)
(52) U.S. Cl. ........ 438/717; 438/700; 438/703; 438/725; 438/736
(58) Field of Classification Search .......................... None
See application file for complete search history.

(56) References Cited

U.S. PATENT DOCUMENTS

| 6,368,979 B1 * | 4/2002 | Wang et al. ................ 438/723 |
| 2004/0108569 A1 * | 6/2004 | Breen et al. ................ 257/500 |
| 2005/0250290 A1 * | 11/2005 | Temmler ................ 438/387 |
| 2009/0246713 A1 * | 10/2009 | Zin et al. ................ 430/323 |
| 2011/0039416 A1 * | 2/2011 | Cole et al. ................ 438/714 |

OTHER PUBLICATIONS

Abstract of: Smith, S.R., et al., Physical properties of PECVD amorphous carbon deposited at high temperature for use as an etch hard mask, Advanced Metallization Conference 2006 (AMC 2006). 2007, US.

* cited by examiner

*Primary Examiner* — N Drew Richards
*Assistant Examiner* — Peter Bradford
(74) *Attorney, Agent, or Firm* — Ditthavong Mori & Steiner, P.C.

(57) ABSTRACT

Small feature patterning is accomplished using a multilayer hard mask (HM). Embodiments include sequentially forming a first HM layer and a multilayer HM layer over a substrate, the multilayer HM layer comprising sublayers, etching the multilayer HM layer to form a first opening having an upper first opening with sides converging to a lower second opening and a second opening with substantially parallel sides and an opening substantially corresponding to the lower second opening of the first opening, etching through the second opening to form a corresponding opening in the first HM layer, and etching the substrate through the corresponding opening in the first HM layer.

19 Claims, 3 Drawing Sheets

US 8,071,485 B2

METHOD OF SEMICONDUCTOR MANUFACTURING FOR SMALL FEATURES

TECHNICAL FIELD

The present disclosure relates to a method of patterning small features with a vertical profile. The present disclosure is particularly applicable to 32 nanometer (nm) technology nodes and beyond.

BACKGROUND

As the dimensions of semiconductor devices continue to shrink, various issues arise imposing increasing demands for methodology enabling patterning of smaller features without sacrificing pattern profiles. Previous methods of patterning smaller features resulted in poor pattern profiles and in insufficient critical dimension (CD) shrink. Known solutions to the problem include extreme ultraviolet (EUV) lithography and electron beam (e-Beam) lithography. However, both methods are expensive, and thus do not provide satisfactory manufacturing solutions. Another proposed solution involves low temperature oxide (LTO), or oxide spacer, CD shrink. However, LTO shrink has pattern density loading effects and the potential for defects.

A prior approach to form small features, such as stacked poly gates and densely packed contacts and metal lines, is illustrated in FIGS. 1A-1D and employs a silicon antireflective coating (SiARC)/hard mask (HM) shrink. The method employs an amorphous carbon HM, as amorphous carbon allows high etch selectivity to films typically used in the semiconductor industry, i.e., it exhibits good plasma etch selectivity during oxide or nitride etches, and it can be easily removed with an oxygen plasma.

Adverting to FIG. 1A, substrate 101, the layer to be patterned, can be an insulating layer, a semiconductor layer, such as bulk silicon or silicon germanium, or a metal layer. Amorphous carbon layer 103, i.e., the HM, antireflective coating (ARC) 105, and resist 107 are consecutively formed over substrate 101.

As illustrated in FIG. 1B, resist 107 is etched to form an opening 109 which is larger than the desired feature size. The resist is used as a mask to etch ARC 105 in FIG. 1C. ARC shrink is employed to enable smaller feature patterning. In other words, ARC 105 is etched with a tapered profile 111 to form an opening that converges from upper opening 109 to a smaller lower opening 113. Amorphous carbon layer 103 is also etched with a tapered profile 117 to further reduce the feature size in the substrate. The resulting amorphous carbon layer 103 is used as a mask for patterning substrate 101.

It was found, however, that when substrate 101 is etched, the tapering in carbon layer 103 created an environment that induced a significant degree of high bias ion reflection resulting in bowing 119 illustrated in FIG. 1D and, consequently poor profiles, thereby limiting CD shrink capability.

A need therefore exists for methodology enabling formation of smaller features without sacrificing pattern profiles.

SUMMARY

An aspect of the present disclosure is a method of patterning a substrate using a multilayer hard mask.

Another aspect of the present disclosure is a semiconductor chip or device formed by patterning using a multilayer hard mask.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a first hard mask (HM) layer over a substrate; forming a second HM layer over the first HM layer; forming a third HM layer over the second HM layer; etching the third HM layer to form a third HM comprising a tapered opening having an upper first opening with sides converging to a lower second opening; etching the second HM using the third HM to form a second HM comprising an opening substantially corresponding to the lower second opening of the third HM; etching the first HM layer to form a first HM comprising an opening substantially corresponding to the opening in the second HM; and etching the substrate using the first HM.

Aspects of the present disclosure include providing an etch stop layer, having greater etch selectivity than that of the second HM layer between the first and the second HM layers. Further aspects include forming the third HM layer at a first thickness, e.g., about 100 nm to about 500 nm, and forming the second HM layer at a second thickness less than the first thickness, e.g., about 5 nm to about 80 nm, for example about 10 nm to about 20 nm. Additional aspects include forming the first HM layer at a thickness of about 100 nm to about 500 nm. Another aspect includes forming the first and third HM layers from a carbon-containing material, e.g., forming the first HM layer from amorphous carbon, and forming the third mask layer from amorphous carbon, diamond like carbon, tetrahedral amorphous carbon, or graphite. Further aspects include forming the second HM layer from a silicon-containing material or a high-K oxide, e.g., silicon oxide, and forming the etch stop layer from a silicon nitride or a silicon oxynitride. Another aspect includes etching to form the third HM with sides converging to a lower second opening having a dimension of less than or equal to about 60 nm. Additional aspects include forming an antireflective coating (ARC) on the third HM layer, etching the ARC to form an ARC mask comprising a tapered opening having an upper first opening with sides converging to a lower second opening, etching to form the third HM with the upper opening therein substantially corresponding to the lower second opening of the ARC mask, etching the second HM to form the second HM opening, removing the third HM, and sequentially etching the etch stop layer, first HM, and substrate.

Aspects of the present disclosure include a method of fabricating a semiconductor chip, the method comprising: forming an amorphous carbon first HM layer over a substrate; forming a nitride etch stop layer over the first HM layer; forming an oxide second HM layer at a first thickness over the nitride etch stop layer; forming a carbon-containing third HM layer, at a second thickness greater than the first thickness, over the second HM layer; etching the third HM layer to form a third HM comprising a tapered opening having an upper first opening with sides converging to a lower second opening; etching the second HM using the third HM and stopping on the etch stop layer to form a second HM comprising an opening substantially corresponding to the lower second opening of the third HM; removing the third HM leaving the second HM; and sequentially etching the etch stop layer, first HM layer, and substrate.

Further aspects include forming the third HM layer at a thickness of about 100 nm to about 500 nm, and forming the second HM at a thickness of about 5 nm to about 80 nm, e.g., about 10 nm to about 20 nm. Additional aspects include a semiconductor chip formed by the disclosed methods.

Another aspect of the present disclosure includes a method of fabricating a semiconductor device, the method comprising: forming a first HM layer over a substrate; forming a multilayer HM layer over the first HM layer, the multilayer HM layer comprising sublayers; etching the multilayer HM layer to form a first opening having an upper first opening with sides converging to a lower second opening and a second opening with substantially parallel sides and an opening substantially corresponding to the lower second opening of the first opening; etching through the first opening to form a corresponding opening in the first HM layer; and etching the substrate through the corresponding opening in the first HM layer.

Further aspects include forming the first HM layer from amorphous carbon, forming the first opening in a carbon-containing sub-layer having a first thickness, and forming the second opening in an oxide sub-layer having a second thickness of 5 nm to about 80 nm, the second thickness being less than the first thickness. A further aspect includes semiconductor device produced by the disclosed methods.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
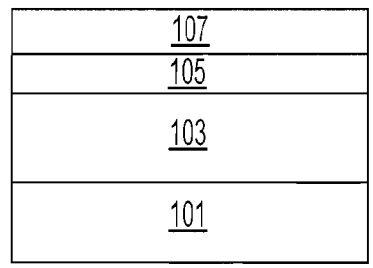
FIGS. 1A-1D schematically illustrate a prior art method of forming small features.
Figure 1B:
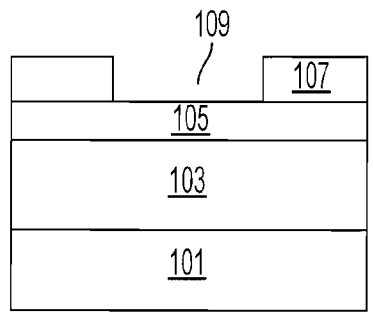
Figure 1C:
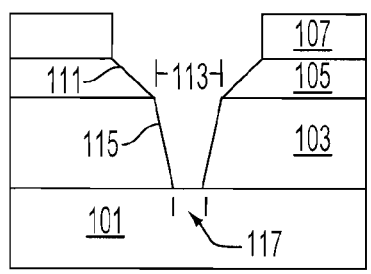
Figure 1D:
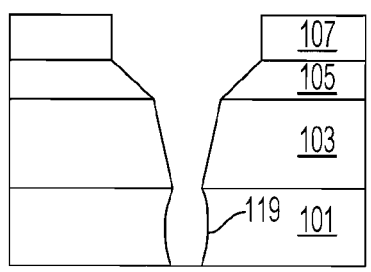

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

Prior practices include forming an amorphous carbon HM layer and an ARC over a substrate and etching each with an angled profile to obtain a mask with a pattern of small features. However, when etching a substrate through the patterned HM layer, a significant degree of high bias ion reflections occur, which result in bowing in the substrate etch.

The present disclosure addresses and solves the problem of bowing during the formation of small features, especially features of about 60 nm or smaller, e.g., smaller than 40 nm, and even smaller than 30 nm. In accordance with embodiments of the present disclosure, bowing is reduced by employing a multilayer HM system. In an embodiment, the multilayer HM system comprises a top carbon-containing layer, an intermediate thin oxide layer, an underlying etch stop layer, and a bottom amorphous carbon layer. An ARC and the top carbon-containing layer are etched with angled profiles. Then the oxide layer is etched using the patterned carbon-containing HM layer as a mask. Because the oxide layer is relatively thin, ion reflection is significantly reduced during etching, and a pattern with substantially vertical sides can be obtained in the oxide layer. The oxide layer can then be used as a mask for sequentially etching the etch stop and amorphous carbon layers, and ultimately the substrate.

Embodiments of the present disclosure include forming a first HM layer over a substrate, forming a second HM layer over the first HM layer, forming a third HM layer over the second HM layer, etching the third HM layer to form a third HM comprising a tapered opening having an upper first opening with sides converging to a lower second opening, etching the second HM using the third HM to form a second HM comprising an opening substantially corresponding to the lower second opening of the third HM, etching the first HM layer to form a first HM comprising an opening substantially corresponding to the opening in the second HM, and etching the substrate using the first HM. Methodology further includes forming the first HM layer of amorphous carbon, to a thickness of about 100 nm to about 500 nm. The second HM layer may be formed of a silicon-containing material, such as silicon oxide, or a high-K oxide, i.e., an oxide having a dielectric constant of about 25 or greater, e.g., hafnium dioxide, hafnium silicate, zirconium dioxide, nitrided hafnium silicates, or titanium oxide, at a thickness of about 5 nm to about 80 nm, such as about 10 nm to about 20 nm. An etch stop layer with higher etch selectivity than the second HM layer, e.g., silicon nitride or silicon oxynitride when the second HM is a silicon oxide, may be formed between the second and third HM layers, at a thickness of about 5 nm to about 80 nm, such as about 10 nm to about 20 nm. The third HM layer may be formed of amorphous carbon, diamond like carbon, tetrahedral amorphous carbon, or graphite, at a thickness of about 100 nm to about 500 nm. Embodiments of the present disclosure further include a semiconductor chip or semiconductor device formed by the methods of the present disclosure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
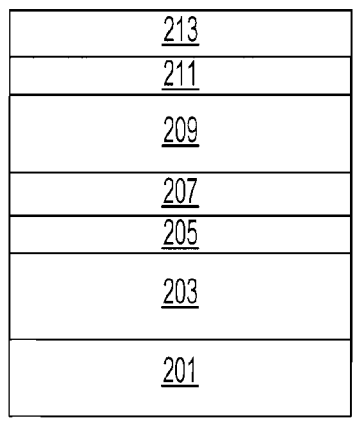
FIGS. 2A-2F schematically illustrate a method of forming small features, according to an exemplary embodiment.

Adverting to FIG. 2A, a multi-layered HM is formed on substrate 201. Like substrate 101 from FIGS. 1A-1D, substrate 201 may be any layer that is to be patterned, such as an insulating layer, a semiconductive layer, such as bulk silicon or silicon germanium, or a metal layer. First HM layer 203 is formed of carbon, such as amorphous carbon, e.g., diamond like carbon (DLC), tetrahedral amorphous carbon (TA-C), or crystalline carbon, e.g., graphite or diamond. However, practically speaking, the crystal phases of carbon are too expensive for use as an HM layer. The thickness of carbon layer 203 may be about 100 nm to about 500 nm, depending on the pattern to be etch, i.e., a trench isolation, damascene line, or gate electrode. For example, when forming a trench isolation in substrate 201, carbon layer 203 may be about 200 nm.

Etch stop layer 205 is formed over carbon layer 203. Etch stop layer 205 may be about 5 nm to about 80 nm in thickness, e.g., about 10 nm to about 20 nm, for example about 10 nm. Etch stop layer 205 may be formed of a nitride, e.g., silicon nitride or silicon oxynitride. Second HM layer 207 is formed over the etch stop layer 205, and comprises a material having a lower etch selectivity than etch stop layer 205, e.g., silicon oxide. Second HM layer 207 may be deposited to a thickness of about 5 nm to about 80 nm, e.g., about 10 nm to about 20 nm, for example, 10 nm.

Third HM layer 209 is then formed over second HM layer 207, and comprises, e.g., a carbon-containing material which may be the same material and/or the same thickness as the first HM layer, or the two HM layers may be different. Embodiments include forming third HM layer 209 of amorphous carbon, for example diamond like carbon (DLC), tetrahedral amorphous carbon (TA-C), or a crystalline phase carbon, such as graphite or diamond, at a thickness of about 100 nm to about 500 nm, e.g., about 200 nm. Oxide layer 207 is advantageously formed at a thickness less than third HM layer 209 to prevent the bowing that would otherwise occur employing conventional practices.

A conventional ARC 211 is formed over the multilayer HM. ARC 211 may be any type of antireflective coating, e.g., a silicon based coating, such as silicon nitride or silicon oxynitride. Atop ARC 211, a resist 213 is formed.

Figure 2B:
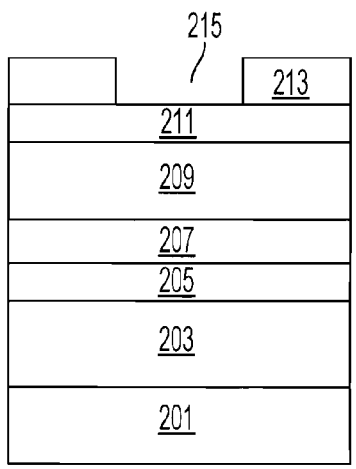
Figure 2C:
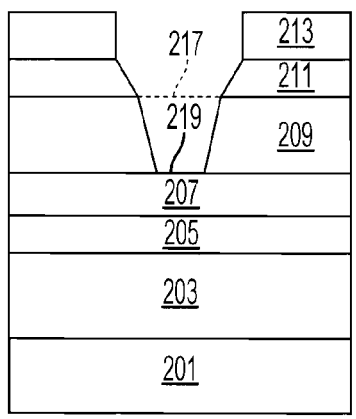

As illustrated in FIG. 2B, opening 215 is formed in resist 213, which is larger than the desired feature pattern, e.g., about 80 nm. Resist 213 is then used as a mask to etch ARC 211 and third HM layer 209, as illustrated in FIG. 2C. ARC layer 211 may be plasma etched under conditions such that a polymer is formed on the side walls creating an angled profile tapering downwardly from a top opening, substantially equal in size to opening 215, e.g., about 80 nm, down to a bottom opening 217 (indicated by a dotted line), smaller than opening 215. Third HM layer 209 is etched through openings 215 and 217 forming a tapered opening with a top opening 217 and a bottom opening 219, smaller than opening 217. Opening 219 corresponds to the desired size of the feature pattern for substrate 201, such as about 60 nm or 65 nm and smaller, e.g., about 40 nm and smaller, even less than about 30 nm.

Figure 2D:
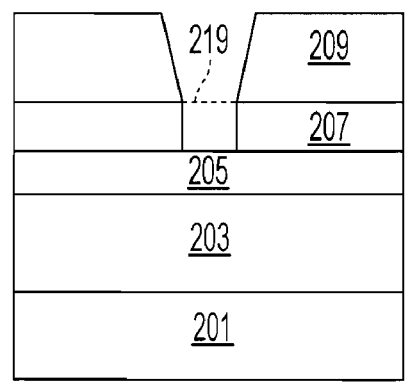

Adverting to FIG. 2D, resist 213 and ARC 211 are removed, and the second HM layer 207 is etched through opening 219 (indicated by a dotted line) down to etch stop layer 205. Because layer 207 is relatively thin with respect to HM layer 209, bowing is reduced, as compared with conventional practices, such that the resulting opening has a substantially vertical profile.

Figure 2E:
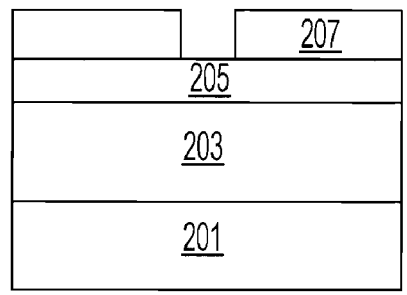
Figure 2F:
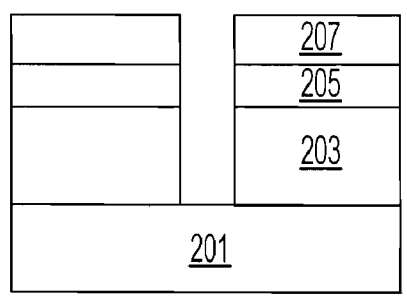

After second HM layer is etched, third HM layer 209 is removed, e.g., by ashing, as illustrated in FIG. 2E. Second HM layer 207 may then be used as a mask for etching the remaining layers. As illustrated in FIG. 2F, etch stop layer 205 and first HM layer 203 are etched through the opening in second HM layer 207. Etching may then continue through substrate 201 using layers 207, 205, and 203 as a mask. Depending on the composition of the substrate and etchant, second HM layer 207 and etch stop layer 205 may be removed when etching substrate 201. For example, if substrate 201 is an oxide, etching of substrate 201 will typically remove second HM layer 207. If, however, substrate 201 is a metal layer, substrate etching may have no effect on second HM layer 207 and etch stop layer 205. In this case, layers 207 and 205 will require a separate wet etch for their removal.

In implementing various embodiments, the layers may be deposited using conventional techniques, such as chemical vapor deposition (CVD), physical vapor deposition (PVD), atomic layer deposition (ALD), or spin-on-dielectric (SOD). Embodiments include forming various types of patterns in various types of substrates typical of semiconductor fabrication, such as trenches for isolation and damascene lines, in which case the CD would be the width of the isolation trench or line, and gate electrodes, Embodiments of the present disclosure achieve several technical effects, including small features, such as about 60 nm or 65 nm and smaller, e.g., about 40 nm and smaller, even less than about 30 nm, without bowing, such that the features have substantially vertical sides. The present disclosure enjoys industrial applicability in fabricating any of various types of semiconductor products, such as logic and memory devices, which require small feature sizes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a first hard mask layer over a substrate, the first hard mask layer comprising a carbon-containing material;
forming a second hard mask layer over the first hard mask layer;
forming a third hard mask layer over the second hard mask layer, the third hard mask layer comprising a carbon-containing material;
etching the third hard mask layer to form a third hard mask comprising a tapered opening having an upper first opening with sides converging to a lower second opening;
etching the second hard mask using the third hard mask to form a second hard mask comprising an opening substantially corresponding to the lower second opening of the third hard mask;
etching the first hard mask layer to form a first hard mask comprising an opening substantially corresponding to the opening in the second hard mask; and
etching the substrate using the first hard mask.

2. The method according to claim 1, comprising providing an etch stop layer, having greater etch selectivity than that of the second hard mask layer between the first and second hard mask layers.

3. The method according to claim 2, comprising:
forming the third hard mask layer at a first thickness; and
forming the second hard mask layer at a second thickness less than the first thickness.

4. The method according to claim 3, comprising forming the second hard mask layer at a thickness of about 5 nm to about 80 nm.

5. The method according to claim 4, comprising forming the second hard mask layer at a thickness of about 10 nm to about 20 nm.

6. The method according to claim 4, comprising forming the third hard mask layer at a thickness of about 100 nm to about 500 nm.

7. The method according to claim 6, comprising forming the first hard mask layer at a thickness of about 100 nm to about 500 nm.

8. The method according to claim 1, comprising:
forming the first hard mask layer from amorphous carbon; and forming the third mask layer from amorphous carbon, diamond like carbon, tetrahedral amorphous carbon, or graphite.

9. The method according to claim 8, comprising forming the second hard mask layer from a silicon-containing material or a high-K oxide.

10. The method according to claim 9, comprising:
forming the second hard mask layer from a silicon oxide; and
forming the etch stop layer from a silicon nitride or a silicon oxynitride.

11. The method according to claim 1, comprising etching to form the third hard mask with the sides of the tapered opening converging to the lower second opening having a dimension less than or equal to about 60 nm.

12. The method according to claim 3, comprising:
forming an antireflective coating (ARC) on the third hard mask layer;
etching the ARC to form an ARC mask comprising a tapered opening having an upper first opening with sides converging to a lower second opening;
etching to form the third hard mask with the upper opening therein substantially corresponding to the lower second opening of the ARC mask;
removing the third hard mask; and
sequentially etching the etch stop layer, first hard mask, and substrate.

13. A method of fabricating a semiconductor chip, the method comprising:
forming an amorphous carbon first hard mask layer over a substrate;
forming a nitride etch stop layer over the first hard mask layer;
forming an oxide second hard mask layer at a first thickness over the nitride etch stop layer;
forming a carbon-containing third hard mask layer, at a second thickness greater than the first thickness, over the second hard mask layer;
etching the third hard mask layer to form a third hard mask comprising a tapered opening having an upper first opening with sides converging to a lower second opening;
etching the second hard mask using the third hard mask and stopping on the etch stop layer to form a second hard mask comprising an opening substantially corresponding to the lower second opening of the third hard mask;
removing the third hard mask leaving the second hard mask; and
sequentially etching the etch stop layer, first hard mask layer, and substrate.

14. The method according to claim 13, comprising:
forming the third hard mask layer at a thickness of about 100 nm to about 500 nm; and
forming the second hard mask at a thickness of about 5 nm to about 80 nm.

15. The method according to claim 14, comprising forming the second mask layer at a thickness of about 10 nm to about 20 nm.

16. A semiconductor chip formed by the method according to claim 13.

17. A method of fabricating a semiconductor device, the method comprising:
forming a first hard mask layer over a substrate;
forming a multilayer hard mask layer over the first hard mask layer, the multilayer hard mask layer comprising sublayers;
forming an antireflective coating (ARC) on the multilayer hard mask layer;
etching the ARC to form a first tapered opening having sides converging from a first top opening to a first bottom opening at a top surface of the multilayer hard mask layer;
etching the multilayer hard mask layer to form a second opening having an upper third opening, corresponding to the first bottom opening with sides converging to a lower fourth opening and a third opening with substantially parallel sides and an opening substantially corresponding to the lower fourth opening of the second opening;
etching through the third opening to form a corresponding opening in the first hard mask layer; and
etching the substrate through the corresponding opening in the first hard mask layer.

18. The method according to claim 17, comprising:
forming the first hard mask layer from amorphous carbon;
forming the second opening in a carbon-containing sub-layer having a first thickness; and
forming the third opening in an oxide sub-layer having a second thickness of about 5 nm to about 80 nm, the second thickness being less than the first thickness.

19. A semiconductor device produced by the method according to claim 17.

* * * * *